US012640347B2

(12) United States Patent　　　　(10) Patent No.:　US 12,640,347 B2
Ashida　　　　　　　　　　　　　　　(45) Date of Patent:　　　May 26, 2026

(54) ELECTROMAGNETIC WAVE SUPPLY MECHANISM AND PLASMA PROCESSING APPARATUS

(71) Applicant: Tokyo Electron Limited, Tokyo (JP)

(72) Inventor: Mitsutoshi Ashida, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 99 days.

(21) Appl. No.: 18/820,762

(22) Filed: Aug. 30, 2024

(65) Prior Publication Data

US 2025/0087463 A1　　　Mar. 13, 2025

(30) Foreign Application Priority Data

Sep. 7, 2023　　(JP) ................................. 2023-145023

(51) Int. Cl.
　　*H01J 37/32*　　　　　(2006.01)
(52) U.S. Cl.
　　CPC ... *H01J 37/32311* (2013.01); *H01J 37/32201* (2013.01); *H01J 37/32229* (2013.01); *H01J 37/32275* (2013.01); *H01J 2237/332* (2013.01)
(58) Field of Classification Search
　　CPC .......... H01J 37/32311; H01J 37/32201; H01J 37/32229; H01J 37/32275; H01J 2237/332; H01J 37/3211; H01J 37/32183; H01J 37/3244; H01J 37/32532
　　See application file for complete search history.

(56) References Cited

U.S. PATENT DOCUMENTS

2012/0247676 A1* 10/2012 Fujino ................ H01J 37/32211
　　　　　　　　　　　　　　　　　　118/723 MW
2018/0374680 A1* 12/2018 Ikeda ................ H01L 21/67739
2022/0037124 A1* 2/2022 Itoh ........................ C23C 16/509

FOREIGN PATENT DOCUMENTS

JP　　　　2012-216745 A　　11/2012

* cited by examiner

*Primary Examiner* — Minh Tran
(74) *Attorney, Agent, or Firm* — Armstrong Teasdale LLP

(57)　　　　　ABSTRACT

An electromagnetic wave supply mechanism for supplying an electromagnetic wave into a processing container serving as a load, includes a first branch circuit provided downstream of a radio-frequency power source for generating the electromagnetic wave. The first branch circuit includes a first waveguide having an input end, a plurality of second waveguides having respective output ends, and a branch point at which the first waveguide is branched into the second waveguides corresponding to n branches. Each output end is connected to the load or an input end of a second branch circuit subsequent to the first branch circuit. In the first branch circuit, when a total number of the output ends seen from the branch point is n, lengths of the second waveguides from the branch point to the n output ends differ from each other by $m \times \lambda/2 + (\lambda/2)/n$.

11 Claims, 8 Drawing Sheets

$1/\sqrt{n}$　$1/\sqrt{n}$　$1/\sqrt{n}$ $1/\sqrt{n}$　$1/\sqrt{n}$ n branches $\sqrt{n}$ 1　1　1　1　1 n-synthesis

ELECTROMAGNETIC WAVE SUPPLY MECHANISM AND PLASMA PROCESSING APPARATUS

CROSS-REFERENCE TO RELATED APPLICATION

This application is based upon and claims the benefit of priority from Japanese Patent Application No. 2023-145023, filed on Sep. 7, 2023, the entire contents of which are incorporated herein by reference.

TECHNICAL FIELD

The present disclosure relates to an electromagnetic wave supply mechanism and a plasma processing apparatus.

BACKGROUND

A plasma processing apparatus disclosed in Patent Document 1 includes a processing container in which an object to be processed is accommodated, a stage provided inside the processing container and having a placement surface on which the object is placed, a gas supply mechanism for supplying a processing gas into the processing chamber, and a microwave introduction device for generating a microwave to produce plasma of the processing gas inside the processing container and for introducing the microwave into the processing container. The microwave introduction device includes a conductive member which is disposed above the processing container and has a plurality of openings, and a plurality of microwave transmitting windows which is fitted into the plurality of openings and transmits and introduces the microwave into the processing container. The microwave transmitting windows are arranged on one virtual plane parallel to the placement surface, with the microwave transmitting windows fitted into the respective openings. The microwave transmitting windows includes a first microwave transmitting window, and second and third microwave windows adjacent to the first microwave transmitting window. The first to third microwave transmitting windows are arranged in such a manner that a distance between the center point of the first microwave transmitting window and the center point of the second microwave transmitting window becomes equal or approximately equal to a distance between the center point of the first microwave transmitting window and the center point of the third microwave transmitting window.

PRIOR ART DOCUMENT

Patent Document

Patent Document 1: Japanese Laid-Open Patent Publication No. 2012-216745

SUMMARY

According to one embodiment of the present disclosure, an electromagnetic wave supply mechanism for supplying an electromagnetic wave into a processing container serving as a load, includes a first branch circuit provided downstream of a radio-frequency power source configured to generate the electromagnetic wave, the first branch circuit being configured as a waveguide and including a first waveguide having an input end, a plurality of second waveguides having respective output ends, and a branch point at which the first waveguide is branched into the plurality of second waveguides corresponding to n branches (where n is an integer equal to or greater than 2), wherein each of the output ends is connected to the load or an input end of a second branch circuit subsequent to the first branch circuit, and in the first branch circuit, when a total number of the output ends seen from the branch point is n, lengths of the plurality of second waveguides from the branch point to the n output ends differ from each other by $m \times \lambda/2 + (\lambda/2)/n$ (where m is 0 or a positive integer).

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a diagram schematically illustrating an example of a ceiling wall portion of a processing container according to the embodiment.

FIG. 3 is a diagram illustrating an example of a branch circuit according to the embodiment.

DETAILED DESCRIPTION

Hereinafter, embodiments of a disclosed electromagnetic wave supply mechanism and plasma processing apparatus will be described in detail with reference to the drawings. The disclosed technology is not limited to the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a plasma processing apparatus, for example, when electromagnetic waves are introduced into a processing container from a plurality of transmitting windows or a plurality of electrodes, the electromagnetic waves are supplied to the transmitting windows or the electrodes from a radio-frequency power source via each matcher provided for each of the transmitting windows or each of the electrodes. For example, a variable capacitor or a variable inductor may be used as the matcher. In this case, the lifespan and a matching time of sliding parts are impotent. In this regard, it may be considered to minimize the number of matchers and consume reflected power using an isolator. However, when the reflected power is large, power loss due to the isolator increases, and thus, power consumption of the radio-frequency power source increases. Therefore, in order to reduce the power consumption of the radio-frequency power source while minimizing the number of matchers, it is necessary to reduce the reflected power when the electromagnetic waves are branched and introduced to plural locations.

<Configuration of Plasma Processing Apparatus 100>

Figure 1:
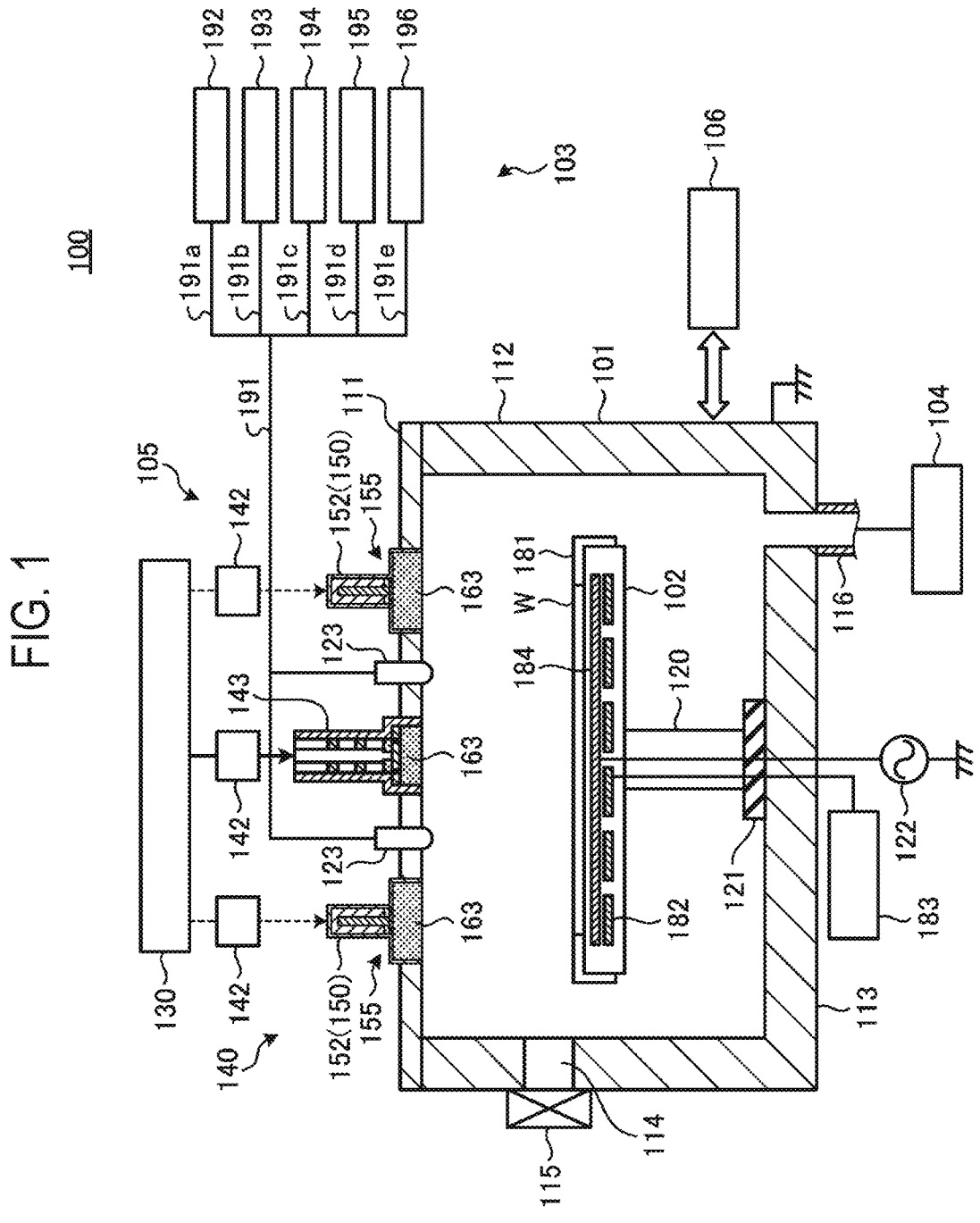
FIG. 1 is a schematic cross-sectional view illustrating an example of a plasma processing apparatus according to an embodiment of the present disclosure.

FIG. 1 is a schematic cross-sectional view illustrating an example of a plasma processing apparatus according to an embodiment of the present disclosure. A plasma processing apparatus 100 illustrated in FIG. 1 includes a processing container 101, a stage 102, a gas supply mechanism 103, an exhaust device 104, a microwave introduction device 105, and a controller 106. The processing container 101 accommodates a substrate W. The substrate W is placed on the stage 102. The gas supply mechanism 103 supplies gas into the processing container 101. The exhaust device 104 exhausts the interior of the processing container 101. The microwave introduction device 105 generates microwaves for generating plasma in the processing container 101 and also introduces the microwaves into the processing container 101. The controller 106 controls the operation of each part of the plasma processing apparatus 100.

The processing container 101, which is made of a metallic material such as aluminum and an alloy thereof and has an approximately cylindrical shape, includes a plate-shaped ceiling wall portion 111, a bottom wall portion 113, and a sidewall portion 112 connecting the ceiling wall portion 111 and the bottom wall portion 113. The microwave introduction device 105 is provided above the processing container 101 and functions as a plasma generation means for generating plasma by introducing electromagnetic waves (microwaves) into the processing container 101. The microwave introduction device 105 will be described in detail later.

The ceiling wall portion 111 has a plurality of openings into which a microwave radiation mechanism, an output end of a second waveguide, and a gas introduction portion, which will be described later, of the microwave introduction device 105 are fitted. The sidewall portion 112 has a loading/unloading port 114 for loading/unloading the substrate W, which is a substrate to be processed, to/from a transfer chamber (not shown) adjacent to the processing container 101. The loading/unloading port 114 is configured to be opened and closed by a gate valve 115. The bottom wall portion 113 is provided with the exhaust device 104. The exhaust device 104 is installed in an exhaust pipe 116 connected to the bottom wall portion 113, and includes a vacuum pump and a pressure control valve. The interior of the processing container 101 is exhausted via the exhaust pipe 116 by the vacuum pump of the exhaust device 104. An internal pressure of the processing container 101 is controlled by the pressure control valve.

The stage 102 has a disc shape and is made of a ceramic such as AlN. The stage 102 is supported by a support member 120 made of a cylindrical ceramic, such as AlN, extending upward from the center of the bottom of the processing container 101, and a base member 121. A guide ring 181 for guiding the substrate W is provided on an outer edge of the stage 102. Further, lifting pins (not shown) for raising and lowering the substrate W are provided inside the stage 102 so as to move up and down with respect to an upper surface of the stage 102.

In addition, a resistance heater 182 is embedded in the stage 102. The heater 182 is supplied with power from a heater power source 183 to heat the substrate W on the stage 102 via the stage 102. Further, a thermocouple (not shown) is inserted into the stage 102. A heating temperature of the substrate W may be controlled to a predetermined temperature in a range of, for example, 300 to 1,000 degrees C., based on a signal from the thermocouple. In addition, an electrode 184 having approximately the same size as the substrate W is buried above the heater 182 in the stage 102. A radio-frequency bias power source 122 is electrically connected to the electrode 184. A radio-frequency bias for drawing ions is applied to the stage 102 from the radio-frequency bias power source 122. The radio-frequency bias power source 122 may be omitted depending on characteristics of plasma processing.

The gas supply mechanism 103 serves to introduce a plasma generation gas and, for example, a raw material gas for forming a graphene film (carbon-containing film) into the processing container 101. The gas supply mechanism 103 includes a plurality of gas introduction nozzles 123. The gas introduction nozzles 123 are fitted into the openings formed in the ceiling wall portion 111 of the processing container 101. A gas supply pipe 191 is connected to the gas introduction nozzles 123. The gas supply pipe 191 is branched into five branch pipes 191a, 191b, 191c, 191d, and 191e. An Ar gas source 192, an $O_2$ gas source 193, an $N_2$ gas source 194, an $H_2$ gas source 195, and a $C_2H_2$ gas source 196 are connected to the branch pipes 191a, 191b, 191c, 191d, and 191e, respectively. The Ar gas source 192 supplies an Ar gas as a noble gas (rare gas), which is the plasma generation gas. The $O_2$ gas source 193 supplies an $O_2$ gas as an oxidizing gas, which is a cleaning gas. The $N_2$ gas source 194 supplies a $N_2$ gas used as a purge gas or the like. The $H_2$ gas source 195 supplies a $H_2$ gas as a reducing gas. The $C_2H_2$ gas source 196 supplies an acetylene ($C_2H_2$) gas as a carbon-containing gas, which is a film forming raw material gas. The $C_2H_2$ gas source 196 may supply other carbon-containing gases such as ethylene ($C_2H_4$).

The branch pipes 191a, 191b, 191c, 191d, and 191e is provided with, although not shown, a mass flow controller for flow rate control and valves located on front and rear sides of the mass flow controller. Further, a shower plate may be provided to supply the $C_2H_2$ gas and the $H_2$ gas to a position close to the substrate W, thereby adjusting gas dissociation. Further, the same effect may be obtained by extending the nozzles for supplying these gases downward.

As described above, the microwave introduction device 105 is provided above the processing container 101 and functions as a plasma generation means that introduces electromagnetic waves (microwaves) into the processing container 101 to generate plasma. The microwave introduction device 105 is an example of an electromagnetic wave supply mechanism.

The microwave introduction device 105 includes the ceiling wall portion 111 of the processing container 101, a microwave outputter 130, and an antenna unit 140. The ceiling wall portion 111 functions as a ceiling plate. The microwave outputter 130 generates a microwave, and distributes and outputs the same to a plurality of paths. The antenna unit 140 introduces the microwave output from the microwave outputter 130 into the processing container 101.

The microwave outputter 130 includes a microwave power source, a microwave oscillator, an amplifier, and a distributor. The microwave oscillator is a solid-state oscillator and oscillates the microwave (e.g., by a phase locked loop (PLL) manner) at, for example, 860 MHz. The frequency of the microwave is not limited to 860 MHz and may be in a range of 700 MHz to 10 GHz such as 2.45 GHz, 8.35 GHz, 5.8 GHz, and 1.98 GHz. Further, the microwave oscillator may vary an oscillation frequency by, for example, frequency modulation. The amplifier amplifies the microwave oscillated by the microwave oscillator. The distributor distributes the microwave amplified by the amplifier to multiple paths. The distributor distributes the microwave while matching impedances of an input side and an output side. The distributor distributes the microwave into, for example, one microwave radiation mechanism 143 and three branch circuits 150, which will be described later.

The antenna unit 140 includes the microwave radiation mechanism 143 arranged at the center of the ceiling wall portion 111, and the branch circuits 150. A plurality of output ends 155 of second waveguides 152 constituting the branch circuits 150 is arranged on the same circumference so as to surround the microwave radiation mechanism 143. Each of the branch circuits 150 includes, as will be described later, a first waveguide 151, two second waveguides 152, and a branch point 153 at which the first waveguide 151 is branched into the two second waveguides 152 corresponding to two branches. For example, three branch circuits 150 are arranged around the microwave radiation mechanism 143. That is, for example, six output ends 155 of the second waveguides 152 are arranged around the microwave radiation mechanism 143. Amplifiers 142 are respectively provided between the microwave outputter 130 and the microwave radiation mechanism 143 and between the microwave outputter 130 and each of the branch circuits 150. Microwaves distributed by the distributor of the microwave outputter 130 are amplified by the amplifiers 142. The microwaves output from the amplifiers 142 are radiated to the processing container 101 from microwave transmitting plates 163 (to be described later) of the antenna unit via the microwave radiation mechanism 143 and each of the branch circuits 150.

Each of the amplifiers 142 includes a phase shifter, a variable gain amplifier, a main amplifier, and an isolator. The phase shifter shifts a phase of the microwave. The variable gain amplifier adjusts a power level of the microwave input to the main amplifier. The main amplifier is configured as a solid-state amplifier. The isolator isolates reflected microwaves that are reflected to the microwave radiation mechanism 143 and the branch circuits 150 and are directed toward the main amplifier. Matchers may be provided between the amplifiers 142 and the branch circuits 150.

The microwave transmitting plates 163 fitted into the ceiling wall portion 111 are provided on a lower surface side of the microwave radiation mechanism 143 and on lower surface sides of the output ends of the branch circuits 150. Lower surfaces of the microwave transmitting plates 163 are exposed to an internal space of the processing container 101. Microwaves transmitted via the microwave transmitting plates 163 generate plasma in the internal space of the processing container 101.

Figures 2, 3:
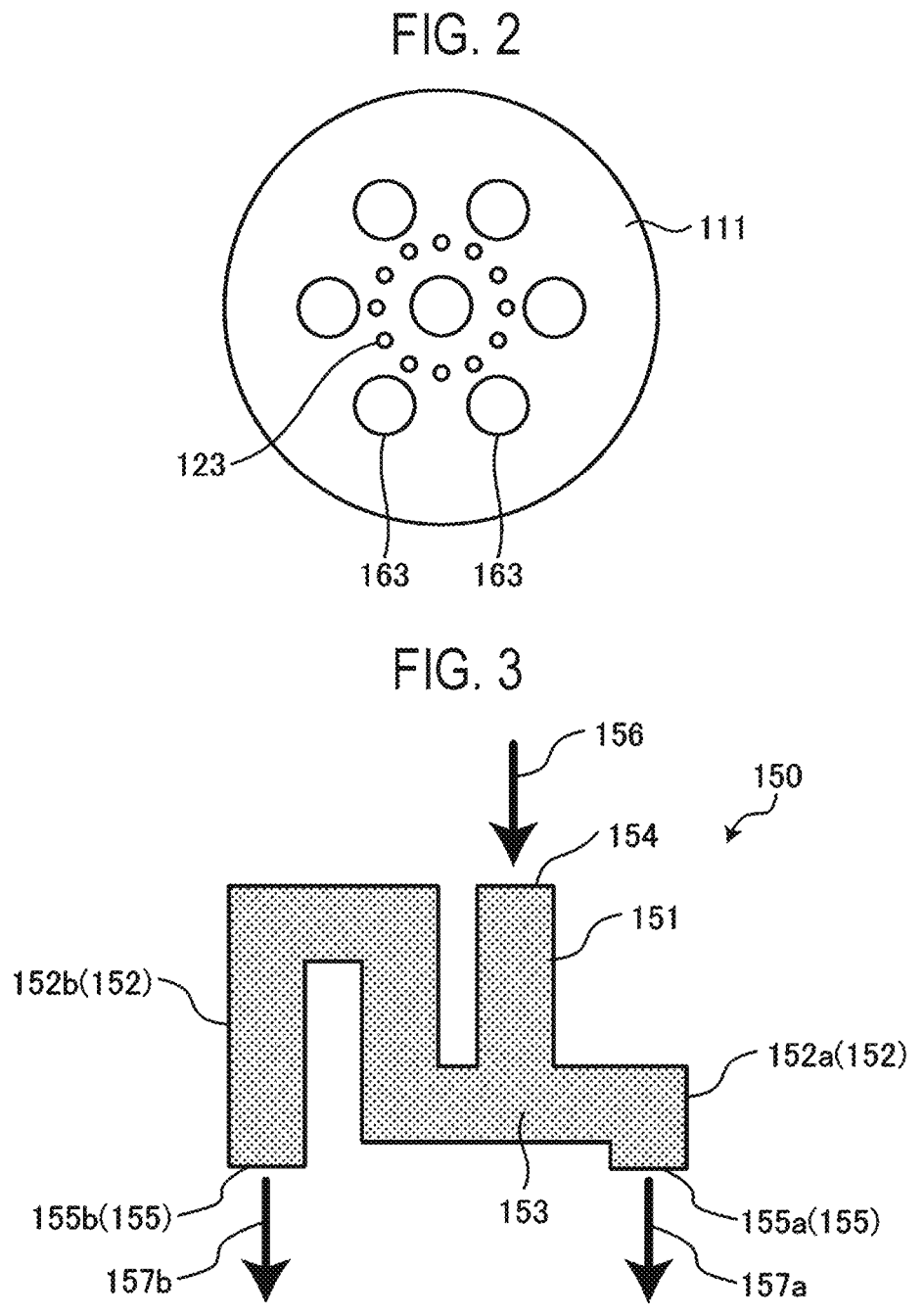

FIG. 2 is a diagram schematically illustrating an example of a ceiling wall portion of a processing container according to the embodiment. As illustrated in FIG. 2, in the embodiment, seven microwave transmission plates 163 through which microwaves are radiated are provided and are evenly disposed in a hexagonal close-packed arrangement. That is, among the seven microwave transmitting plates 163, one microwave transmitting plate corresponding to the microwave radiation mechanism 143 is disposed at the center of the ceiling wall portion 111, and the other six microwave transmitting plates corresponding to the respective output ends 155 are disposed around the center of the ceiling wall portion 111. The six microwave transmitting plates 163 correspond to, for example, the six output ends 155 of the three branch circuits 150. The seven microwave transmitting plates 163 are arranged such that adjacent microwave transmitting plates 163 are spaced apart from each other at equal intervals. Further, the plurality of gas introduction nozzles 123 of the gas supply mechanism 103 is arranged to surround the central microwave transmitting plate 163. The number of the microwave transmitting plates 163 through which microwaves are emitted is not limited to seven.

Referring back to FIG. 1, the controller 106 is typically constituted with a computer and is configured to control each part of the plasma processing apparatus 100. The controller 106 includes a storage, which stores a process sequence of the plasma processing apparatus 100 and process recipes corresponding to control parameters of the plasma processing apparatus 100, an input means, a display, and the like, and is capable of performing predetermined control according to a selected process recipe. For example, the controller 106 controls each part of the plasma processing apparatus 100 so as to perform film formation processing.

<Structure of Branch Circuit 150>

Next, details of the branch circuit 150 will be described with reference to FIGS. 3 and 4. FIG. 3 is a diagram illustrating an example of the branch circuit according to the embodiment. As illustrated in FIG. 3, the branch circuit 150 includes a first waveguide 151, two second waveguides 152, and a branch point 153 at which the first waveguide 151 is branched into the two second waveguides 152 corresponding to two branches. The branch circuit 150 is provided downstream of the microwave outputter 130 (the radio-frequency power source) and the amplifier 142 and is configured as a waveguide. The branch circuit 150 is constituted with, for example, a coaxial cable or a waveguide.

The first waveguide 151 has an input end 154. The input end 154 is connected to the amplifier 142. The first waveguide 151 is branched at the branch point 153 into the two second waveguides 152, that is, second waveguides 152a and 152b. A T-branch circuit model, which will be described later, is applied to the branch circuit 150 including the branch point 153. The second waveguides 152a and 152b have output ends 155a and 155b, respectively. The number of branches at the branch point 153 is not limited to two and may be any n-branch (where n is an integer of 2 or more). In the following description, the second waveguides 152a and 152b and the output ends 155a and 155b may simply be referred to as the second waveguide 152 and the output end 155, respectively, in a case in which they are not distinguished from each other.

The length of each of the plurality of second waveguides 152 is set as follows. When the total number of output ends 155 seen from the branch point 153 is n, the lengths of the second waveguides 152 from the branch point 153 to the n output ends 155 differ from each other by $m \times \lambda/2 + (\lambda/2)/n$, respectively, where X is the wavelength of a microwave. Here, m is the number of revolutions of a voltage reflection coefficient F in a F plane, looking at the load of the output end 155 from the branch point 153, and is 0 or a positive integer. For example, since the second waveguides 152*a* and 152*b* shown in FIG. 3 have two branches, the lengths of the second waveguides 152*a* and 152*b* differ from each other by λ/4 when m=0. The lengths of the first waveguide 151 and the second waveguide 152 are defined as the length of a central conductor in the case of a coaxial cable and are defined as the length of the central axis of a waveguide in the case of the waveguide. In this way, when the lengths of the plurality of second waveguides 152 are different from each other, the second and subsequent second waveguides 152 have a bent structure, which makes it possible to compact the branch circuit 150. For example, in the second waveguides 152*a* and 152*b*, the second waveguide 152*b* has the bent structure as shown in FIG. 3.

In the branch circuit 150, a microwave 156 input from the input end 154 is evenly branched into the second waveguides 152*a* and 152*b* at the branch point 153 via the first waveguide 151, and is output from the output ends 155*a* and 155*b* as microwaves 157*a* and 157*b*, respectively. In the branch circuit 150, as first-order reflected waves are cancelled out by a T-branch circuit model described later, a reflected wave (voltage) to the input end 154 is attenuated by the power of n (where n=2) (by a reflection coefficient $\Gamma^n$). If the reflected wave is considered as power, the power is attenuated by (the reflection coefficient $\Gamma^n)^2$, so that the reflected power may be reduced.

Figures 4, 5, 6:
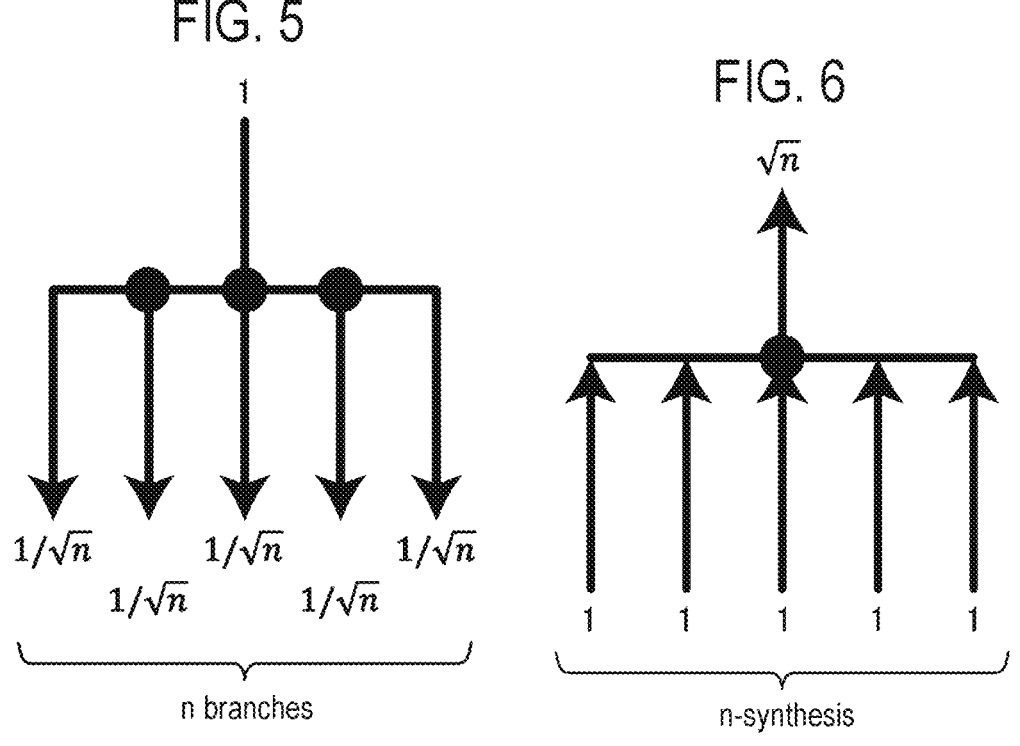
FIG. 4 is a diagram schematically illustrating an example in which branch circuits are connected in series to each other according to the embodiment.
FIG. 5 is a diagram illustrating an example of a distribution model of a multi-port branch circuit.
FIG. 6 is a diagram illustrating an example of a synthesis model of a multi-port branch circuit.

FIG. 4 is a diagram schematically illustrating an example in which branch circuits are connected in series according to the embodiment. In FIG. 4, a state is illustrated in which branch circuits 150*a* and 150*b* are connected in series to output ends 155*a* and 155*b* of the branch circuit 150, respectively. The branch circuits 150*a* and 150*b* have the same configuration as the configuration of the branch circuit 150 to form two-branched branch circuits. A microwave is input to an input end 154*a* of the branch circuit 150*a* from the output end 155*a* of the branch circuit 150 and is evenly branched and output as microwaves 158*a* and 158*b* from output ends 155*c* and 155*d*, respectively. Similarly, the microwave is input from the output end 155*b* of the branch circuit 150 to an input end 154*b* of the branch circuit 150*b* and is evenly branched and output as microwaves 158*c* and 158*d* from output ends 155*e* and 155*f*, respectively. That is, in the example of FIG. 4, the microwave 156 is branched into $2^p$ in a tournament manner by the branch circuit 150, that is, the branch circuits 150*a* and 150*b*, and is output as the microwaves 158*a* to 158*d*. In this case, a reflected wave is attenuated by the reflection coefficient $F^n$. In the example of FIG. 4, p=2 and $n=2^p$. Considering the reflected wave as power, the power is attenuated by (the reflection coefficient $\Gamma^n)^2$, so that the reflected power may be further reduced. In addition, the difference in length between the second waveguides 152 may be considered as the branch circuit 150, that is, each of the branch circuits 150*a* and 150*b*.

<Model of Multi-Port Branch Circuit>

Next, a model of a multi-port branch circuit will be described with reference to FIGS. 5 to 8. FIG. 5 is a diagram illustrating an example of a distribution model of the multi-port branch circuit. FIG. 6 is a diagram illustrating an example of a synthesis model of the multi-port branch circuit. As illustrated in FIG. 5, considering a branch circuit that equally distributes an electromagnetic wave (traveling wave) into waves of the same phase, power becomes 1/n in the case of n branches, and therefore, the amplitude of each of the distributed electromagnetic wave (microwave) (e.g., the amplitude of a voltage) is $1/\sqrt{n}$.

On the other hand, as illustrated in FIG. 6, if an electromagnetic wave is input from an opposite direction to the same branch circuit, the branch circuit becomes a synthesizer if the branch circuit is a passive transmission line. In the case of n-synthesis, the power becomes n times, and therefore, the amplitude of the electromagnetic wave after synthesis becomes $\sqrt{n}$. Here, if all powers are synthesized when all phases are aligned, the amplitude input from each port becomes $(\sqrt{n})/n=1/\sqrt{n}$ times and propagates. Among respective ports on a branch side, it is assumed that the propagation coefficient of one port is a and the propagation coefficient of the other port is b. Considering the relationship when all the phases are aligned, no reflected waves are generated at each port, the relationship of Equation (1) below is established and Equation (1) is modified to Equation (2).

$$a + (n-1) \times b = 0 \qquad (1)$$

$$a = -(n-1)b \qquad (2)$$

Figure 7:
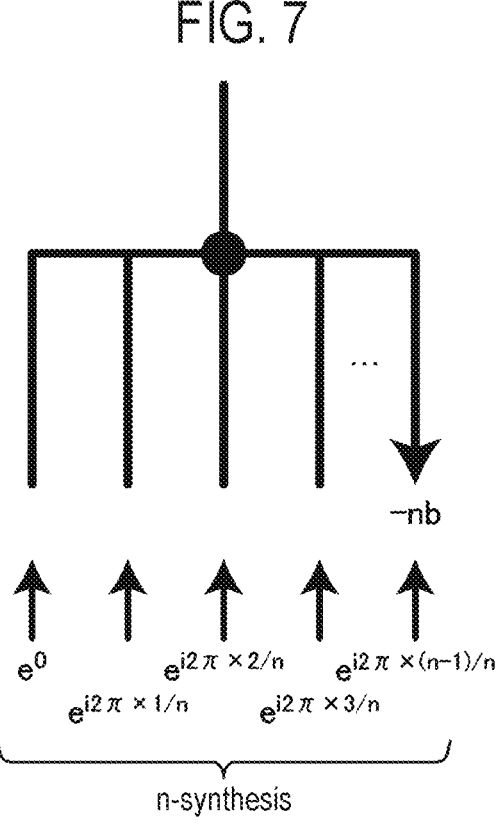
FIG. 7 is a diagram illustrating an example of a propagation model of a multi-port branch circuit.

Subsequently, as a representative condition for realizing total reflection, it is assumed that a phase between ports is shifted by $2\pi/n$. FIG. 7 is a diagram illustrating an example of a propagation model of the multi-port branch circuit. As illustrated in FIG. 7, the phases of the ports are $e^0$, $e^{i2\pi \times 1/n}$, $e^{i2\pi \times 2/n}$, $e^{i2\pi \times 3/n}$, . . . , $e^{i2\pi \times (n-1)/n}$. Since this case is total reflection, Equations (4) and (5) are established from the relationship of Equation (3).

$$\sum e^{i2\pi \times k/n} (\text{where } k = 0 \text{ to } n-1) = 0 \qquad (3)$$

$$1 + \sum e^{i2\pi \times k/n} (\text{where } k = 1 \text{ to } n-1) = 0 \qquad (4)$$

$$\sum e^{i2\pi \times k/n} (\text{where } k = 1 \text{ to } n-1) = -1 \qquad (5)$$

Since the sum of the propagating waves from the ports is "1" (total reflection), Equations (6) to (8) below are established from Equations (2) and (5) above, and Equation (9) is obtained.

$$a + b \times \sum e^{i2\pi \times k/n} (\text{where } k = 1 \text{ to } n-1) = -(n-1)b - b \qquad (6)$$

$$-(n-1)b - b = -nb \qquad (7)$$

$$-nb = 1 \qquad (8)$$

$$b = -1/n \qquad (9)$$

In other words, when viewed from a certain port, intrusion into another port is $-1/n \times e^{i\theta}$, and reflection into the port itself is $(n-1)/n \times e^{i\theta}$. Where, $e^{i\theta}$ indicates that a phase is arbitrary.

Figure 8:
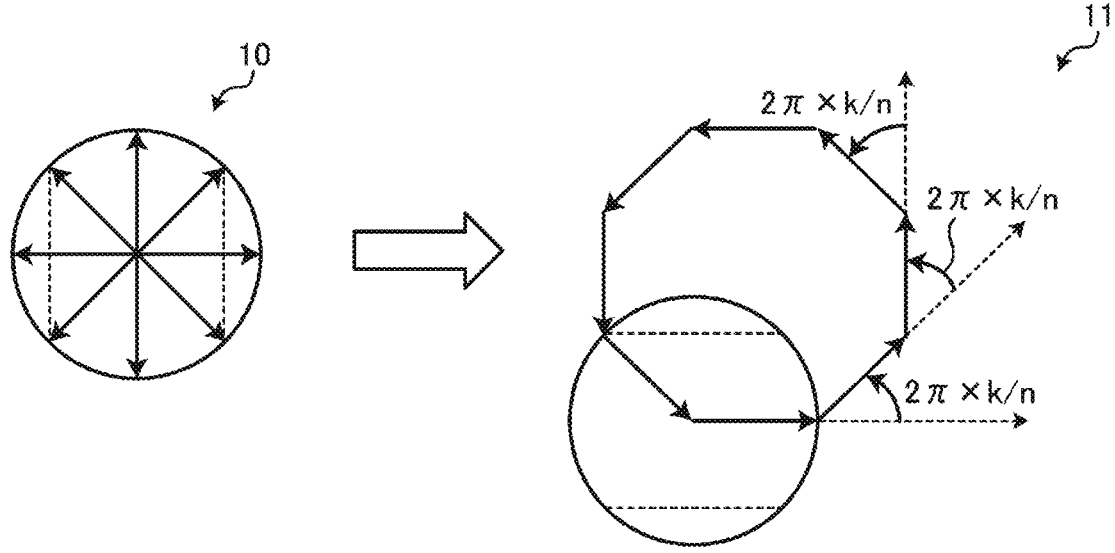
FIG. 8 is a diagram illustrating, as a complex space vector, the sum of propagating waves from respective ports, which is total reflection.

Here, Equation (3) will now be described with reference to FIG. 8. FIG. 8 is a diagram illustrating, as a complex space vector, the sum of propagating waves from respective ports, which is total reflection. A graph 10 in FIG. 8 shows complex space vectors from k=0 to n−1 in Equation (3). The left side of Equation (3) is equivalent to sequentially adding the complex space vectors. In other words, the left side of Equation (3) is equivalent to adding each complex space vector in turn, that is, the left side of Equation (3) becomes "0" because, as illustrated in a graph 11, the complex space vectors are congruent with a regular n-gon, each side of which is the same and interior angles of which are equal.

<T-Branch Circuit Model>

Figures 9, 10:
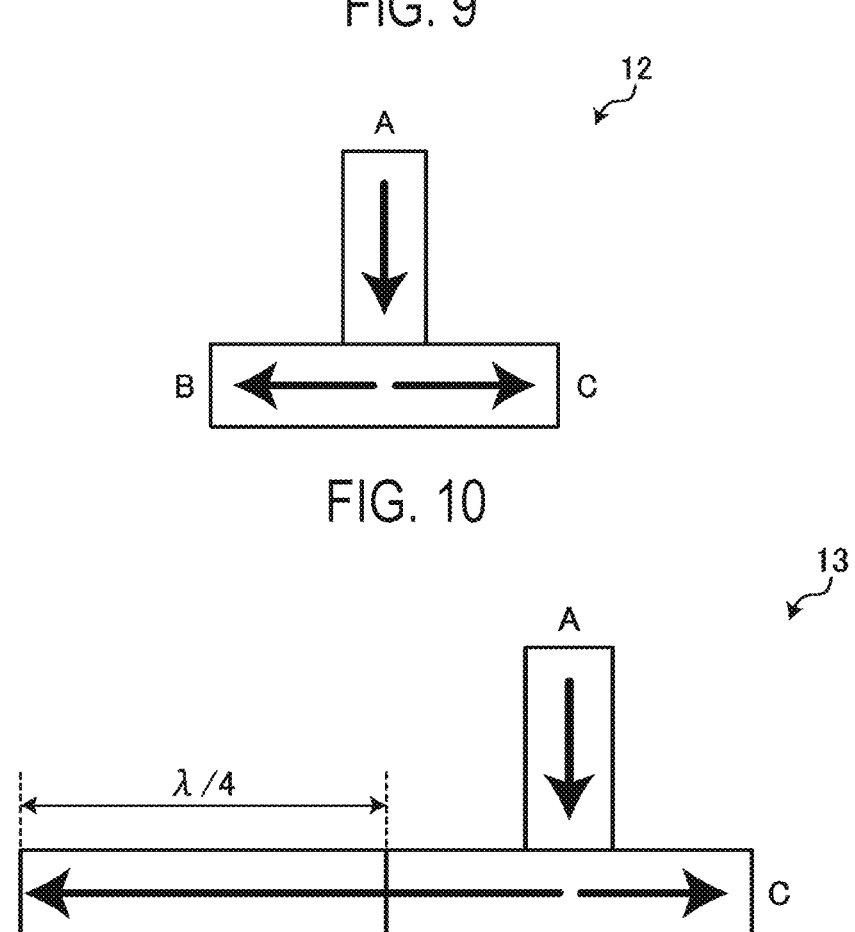
FIG. 9 is a diagram schematically illustrating an example of a T-branch circuit model.
FIG. 10 is a diagram schematically illustrating an example of a T-branch circuit model according to the embodiment

Next, attenuation of a reflected wave by a reflection coefficient $\Gamma^n$ (where n=2) will be described using the T-branch circuit model, which is a two-port branch circuit, with reference to FIGS. 9 to 12. FIG. 9 is a diagram schematically illustrating an example of the T-branch circuit model. A model 12 illustrated in FIG. 9 is a model in which lengths from an input end A to output ends B and C are the same. In the model 12, an electromagnetic wave (traveling wave) input from the input end A is evenly branched to the output ends B and C. Reflected waves at the output ends B and C have the same phase, so that the reflected waves are synthesized at a branch point and return to the input end A.

FIG. 10 is a diagram schematically illustrating an example of the T-branch circuit model according to the embodiment. A model 13 illustrated in FIG. 10 is a model in which a waveguide on the side of the output end B of the model 12 is extended by λ/4, which is a length equivalent to (λ/2)/n. In the model 13, an electromagnetic wave (traveling wave) input from the input end A is evenly branched into the output ends B and C. Since a reflected wave at the output end B has a round-trip path length as long as λ/2, the phase of the reflected wave is shifted by 180 degrees with respect to a reflected wave at the output end C. In other words, the reflected waves at the output ends B and C have opposite phases, so the reflected waves are cancelled out at a branch point.

Figure 11:
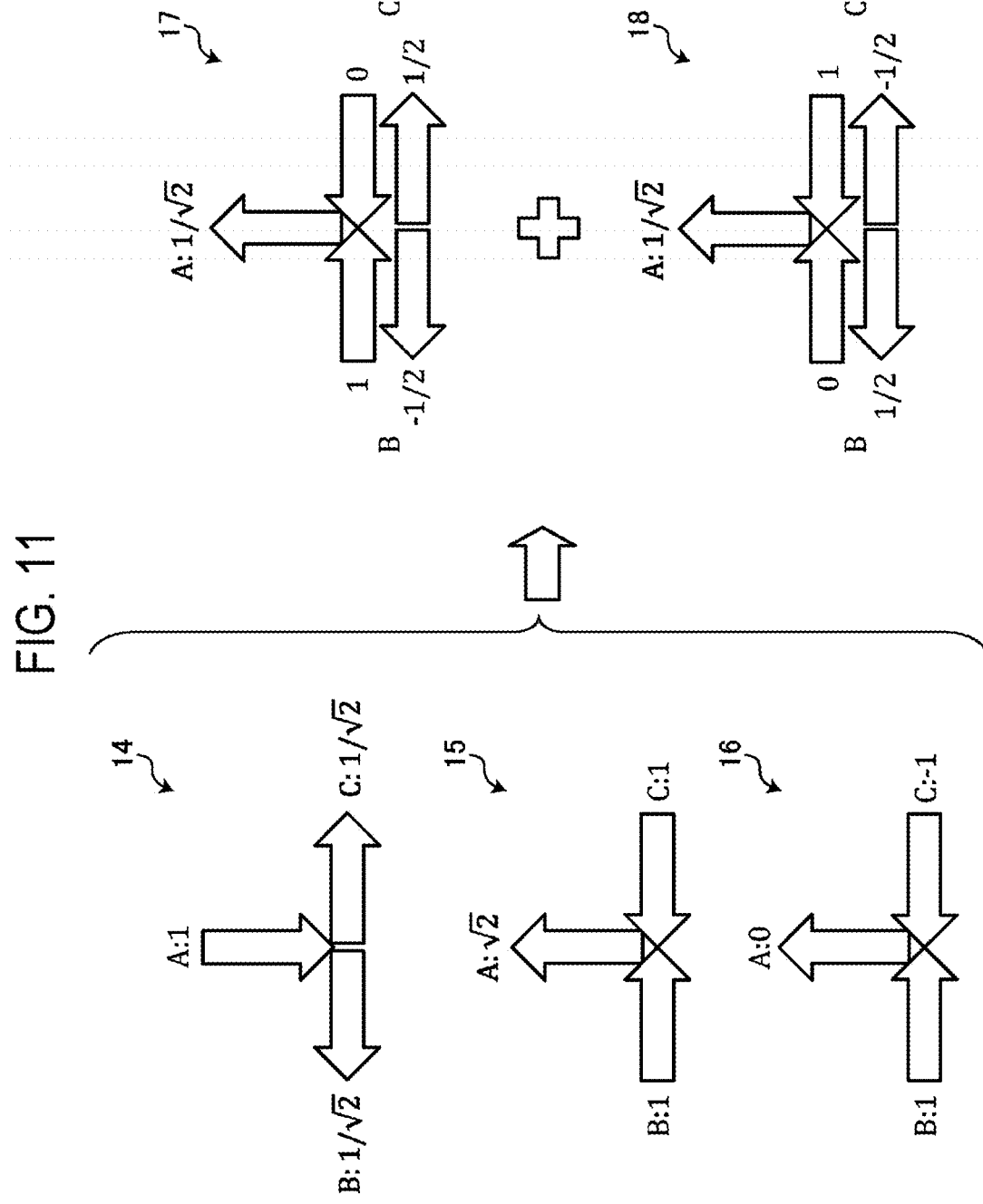
FIG. 11 is a diagram illustrating an example of propagation conditions in the T-branch circuit model.

FIG. 11 is a diagram illustrating an example of propagation conditions in the T-branch circuit model. A propagation condition 14 illustrated in FIG. 11 represents a voltage transmission coefficient 1/√2 for evenly distributing power input from an input end A with an amplitude (voltage amplitude) of "1". In other words, a voltage of "1/√2" is output to each of output ends B and C. In the propagation condition 15, when voltages (reflected waves) with an amplitude of "1" input from the output ends B and C have the same phase, the voltages are synthesized and a voltage with an amplitude of "√2" is output from the input end A. A propagation condition 16 represents that, when a voltage (reflected wave) of "1" input from the output end B and a voltage (reflected wave) of "−1" (phase inversion) input from the output end C have opposite phases, the voltages are synthesized (cancelled out) and a voltage of "0" is output from the input end A.

When the propagation conditions 14 to 16 are satisfied, a reflected wave is considered to propagate as illustrated in the propagation conditions 17 and 18. In the propagation condition 17, a voltage of "1" input from the output end B propagates to the input end A as "1/√2", is reflected at a branch point, returns to the output end B as "−1/2", and propagates to the output end C as "1/2". In the propagation condition 18, a voltage of "1" input from the output end C propagates to the input end A as "1/√2", is reflected at the branch point, returns to the output end C as "−1/2", and propagates to the output end B as "1/2".

Figure 12:
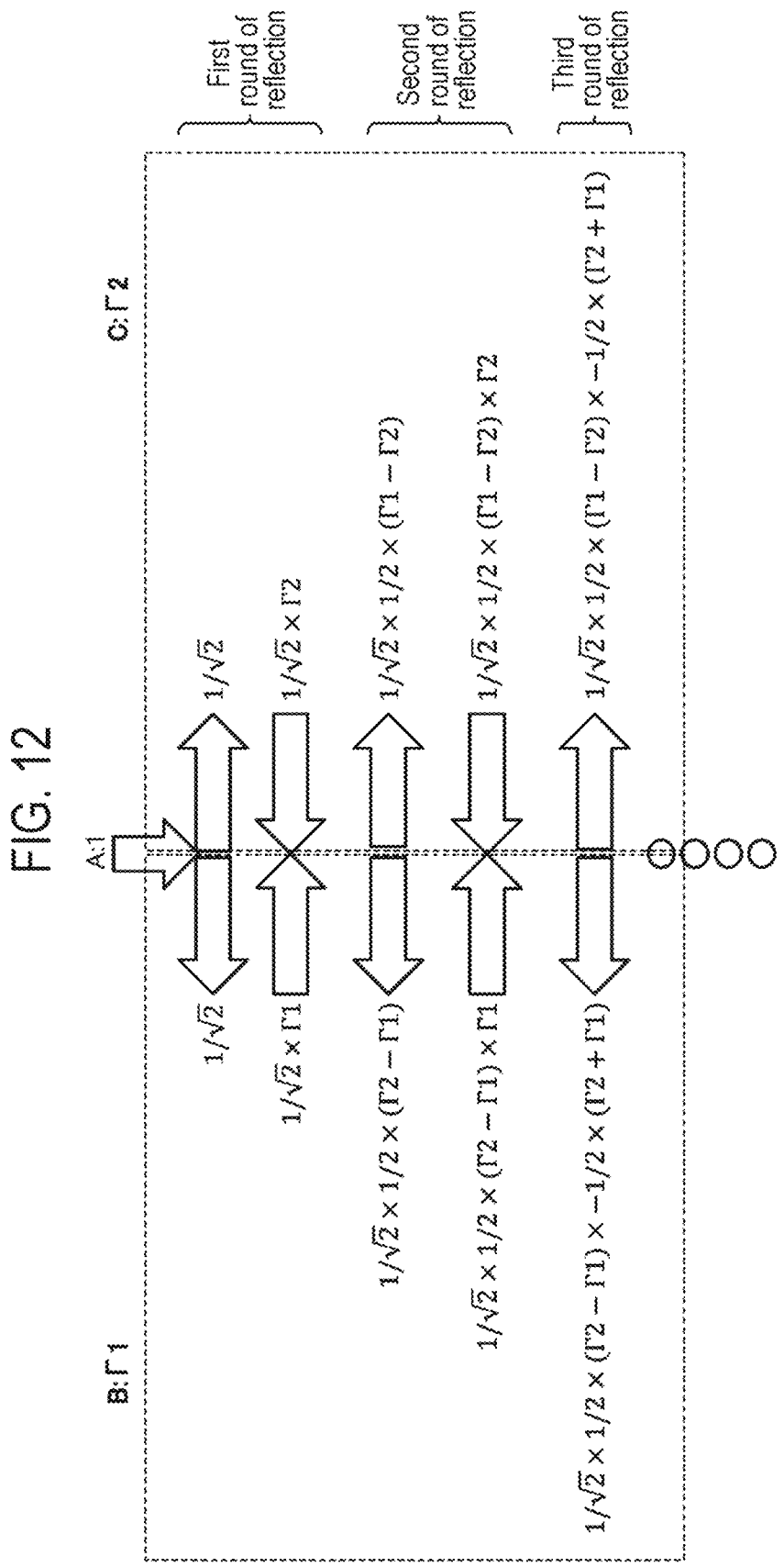
FIG. 12 is a diagram illustrating an example of reflection in the T-branch circuit model.

FIG. 12 is a diagram illustrating an example of reflection in the T-branch circuit model. In FIG. 12, an example of reflection is illustrated at the output ends B and C when a reflected wave in the model 12 propagates as illustrated in the propagation conditions 17 and 18. The output ends B and C are load ends and are assumed to reflect an electromagnetic wave with reflection coefficients $\Gamma 1$ and $\Gamma 2$, respectively.

tively. In addition, in FIG. 12, the electromagnetic wave is represented as the amplitude of a voltage.

An electromagnetic wave (traveling wave) of "1" input from the input end A propagates to the output ends B and C as a wave multiplied by "1/√2". The travelling wave is reflected at the output ends B and C with reflection coefficients $\Gamma 1$ and $\Gamma 2$, respectively, and becomes reflected waves with amplitudes of "1/√2×$\Gamma 1$" and "1/√2×$\Gamma 2$", respectively (a first round of reflection in FIG. 12). Since the reflected waves in the first round of refection enter the branch point in an opposite direction, the reflected waves in the first round of refection are reflected toward the output ends B and C, respectively. The reflected waves from the branch point toward the output ends B and C have amplitudes of "1/√2 1/2×($\Gamma 2$−$\Gamma 1$)" and "1/√2×1/2×($\Gamma 1$−$\Gamma 2$)" respectively. Further, the reflected waves from the branch point toward the output ends B and C are reflected at the output ends B and C with the reflection coefficients $\Gamma 1$ and $\Gamma 2$, respectively (a second round of reflection in FIG. 12). The reflected waves in the second round of refection have amplitudes of "1/√2×1/2×($\Gamma 2$−$\Gamma 1$)×$\Gamma 1$" and "1/√2×1/2×($\Gamma 1$−$\Gamma 2$)×$\Gamma 2$" at the output ends B and C, respectively. The reflected waves in the second round of refection enter the branch point in the opposite direction, so that the reflected waves in the second round of refection are reflected toward the output ends B and C, respectively. The reflected waves from the branch point toward the output ends B and C have amplitudes of "1/√2×1/2×($\Gamma 2$−$\Gamma 1$)×−1/2×($\Gamma 2$+$\Gamma 1$)" and "1/√2×1/2×($\Gamma 1$−$\Gamma 2$)×−1/2×($\Gamma 2$+$\Gamma 1$)", respectively (a third round of reflection in FIG. 12). Subsequently, as in the second round of reflection, reflection is repeated at the output ends B and C.

First, a reflected wave on the side of the output end B is obtained. When the reflected waves in the second round of refection at the output end B are a reflected wave a as shown in Equation (10) below, the total sum S of the reflected waves returning to the branch point after the second round of refection is given by Equation 11 below.

$$a = 1/\sqrt{2} \times 1/2 \times (\Gamma 2 - \Gamma 1) \times \Gamma 1 \qquad (10)$$

$$S = a + a \times (-1/2 \times (\Gamma 2 + \Gamma 1)) + a \times (-1/2 \times (\Gamma 2 + \Gamma 1))^2 + \cdots \qquad (11)$$

Using a general infinite series sum in Equation (11), Equations (12) and (13) are obtained.

$$S - S \times (-1/2 \times (\Gamma 2 + \Gamma 1)) = a \qquad (12)$$

$$S = a/(1 + 1/2 \times (\Gamma 1 + \Gamma 2)) \qquad (13)$$

A total sum Vs of the reflected waves is obtained as in Equation (14) by adding the reflected waves "1/√2×$\Gamma 1$" in the first round of reflection to Equation (13).

$$Vs = 1/\sqrt{2} \times \Gamma 1 + (1/\sqrt{2} \times 1/2 \times (\Gamma 2 - \Gamma 1) \times \Gamma 1)/(1 + 1/2 \times (\Gamma 1 + \Gamma 2)) \qquad (14)$$

For the side of the output end C, as illustrated in FIG. 12, the reflected waves may be obtained in the same way as for the side of the output end B by replacing the reflection coefficient $\Gamma 1$ and the reflection coefficient $\Gamma 2$ with each other.

A synthesis wave Vr returning to the input end A is added by multiplying each reflected wave by "$1/\sqrt{2}$" as illustrated in the propagation conditions 17 and 18, thereby resulting in Equation (15) below.

$$Vr = (\Gamma1 + \Gamma2)/2 - 1/2 \times 1/2 \times (\Gamma2 - \Gamma1)^2/(1 + 1/2 \times (\Gamma2 - \Gamma1)) \quad (15)$$
$$= (\Gamma1 + \Gamma2)/2 - (\Gamma2 - \Gamma1)^2/(2 + (\Gamma2 - \Gamma1))/2$$
$$= ((\Gamma1 + \Gamma2) - (\Gamma2 - \Gamma1)^2/(2 + (\Gamma2 - \Gamma1))/2$$
$$= (\Gamma1 + \Gamma2 + 2 \times \Gamma1 \times \Gamma2)/(2 + \Gamma2 + \Gamma1)$$

Here, when the reflection coefficients are equally the same phase ($\Gamma2=\Gamma1$) to correspond to the model 12, a reflected wave Vrc is as in Equation (16) below. In this case, a voltage standing wave ratio VSWRc is as in Equation (17) below.

$$Vrc = \Gamma1 \quad (16)$$
$$VSWRc = (1 + \Gamma1)/(1 - \Gamma1) \quad (17)$$

Next, when the reflection coefficients are equally opposite phases ($\Gamma2=-\Gamma1$) to correspond to the model 13, a reflected wave Vra is as in Equation (18) below. In this case, a voltage standing wave ratio VSWRa is as in Equation (19) below. Further, the reflection coefficient ($\Gamma2=-\Gamma1$) indicates that the phase of the reflected wave at the output end C is inverted from that at the output end B.

$$Vra = -\Gamma1^2 \quad (18)$$
$$VSWRa = (1 + \Gamma1^2)/(1 - \Gamma1^2) \quad (19)$$

In other words, in the model 13 corresponding to the embodiment, it can be appreciated that the reflected wave is attenuated by the reflection coefficient $\Gamma1^2$.

<Allowable Error of Branch Circuit 150>

Figure 13:
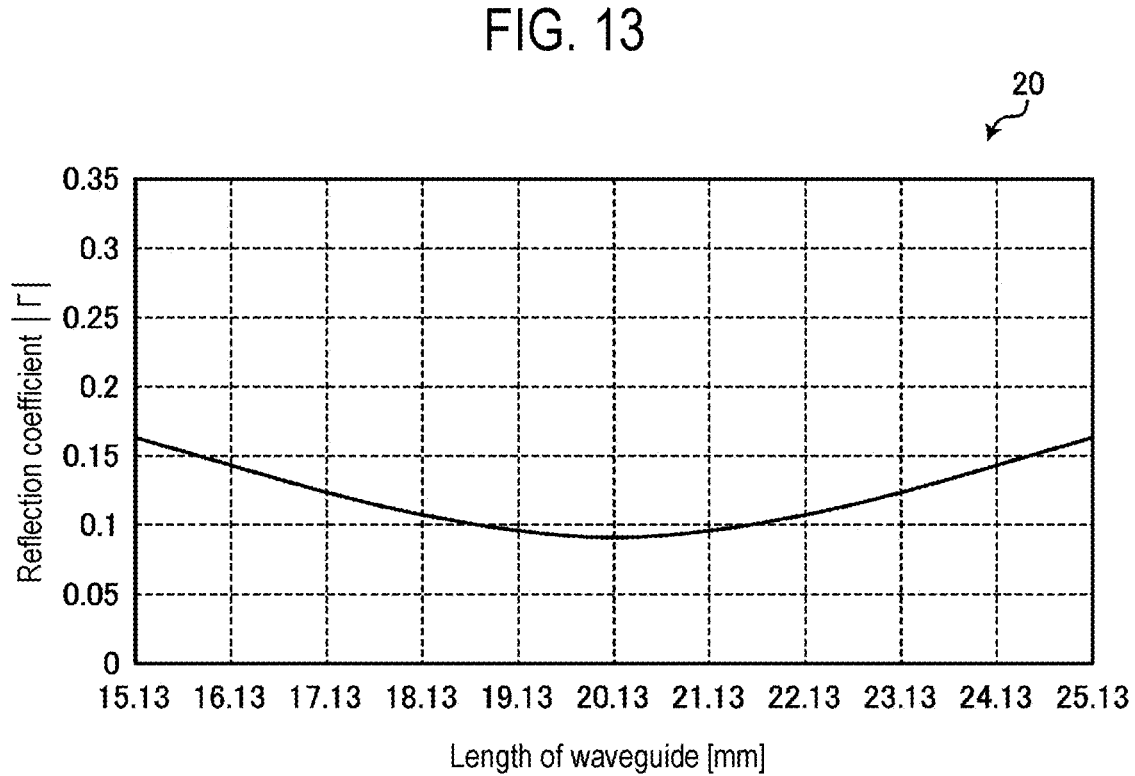
FIG. 13 is a diagram illustrating an example of an allowable error of a difference between lengths of second waveguides according to the embodiment.

Next, an allowable error of the length of the second waveguide 152 in the branch circuit 150 will be described with reference to FIG. 13. FIG. 13 is a diagram illustrating an example of the allowable error of a difference between the lengths of second waveguides according to the embodiment. A graph 20 in FIG. 13 shows a relationship between a waveguide length $\lambda/4$, which is the difference between the lengths of the second waveguides 152, and a reflection coefficient $|\Gamma|$, when an electromagnetic wave of, for example, 2.45 GHz, is input to the branch circuit 150. In the graph 20, reflection coefficients of loads at the output ends 155a and 155b are set to $\Gamma1=\Gamma2=0.3$.

For example, when an insulator of a coaxial cable in the second waveguide 152 is polyethylene, the wavelength $\lambda$ of an electromagnetic wave of 2.45 GHz is 122 mm, and a wavelength shortening rate is 0.66, so that a phase rotates by 360 degrees for every 122 mm×0.66/2=40.26 mm. In other words, when the difference between the lengths of the second waveguide 152a and the second waveguide 152b is $\lambda/4=20.13$ mm, the phases of the output end 155a and the output end 155b rotate (invert) by 180 degrees. In the graph 20, for example, a range in which a reflection coefficient $\sqrt[3]{}|\Gamma|$ is 0.1 or less is 20.13 mm±0.1 mm. In this embodiment, the allowable error is in, for example, the range in which the reflection coefficient $|\Gamma|$ is 0.1 or less, which is estimated to enable practical operation even without a matcher. Here, the range in which the reflection coefficient $|\Gamma|$ is 0.1 or less is a range in which reflected power is 1% or less. In addition, since the graph 20 is defined by a function that converts a phase difference between the second waveguide 152a and the second waveguide 152b into the length of a waveguide, the allowable error is proportional to the wavelength $\lambda$. Therefore, the allowable error is ±1 mm when $\lambda/4=20.13$ mm, so that the allowable error may be $\lambda/80.52$ mm≈±$\lambda/80$ mm. In addition, in the case of n branches, the allowable error is also related to the number of branches, so that the allowable error may be expressed as ±n/40 mm.

While the above embodiment has described a case in which the electromagnetic waves are supplied from the plurality of output ends 155 to one processing container 101, the present disclosure is not limited thereto. For example, the electromagnetic waves may be supplied from each output end 155 of one branch circuit 150 to multiple processing containers (different processing containers) having the same reflection coefficient when the processing containers serve as a load.

In addition, while the embodiment has described the case in which the branch circuit 150 is a coaxial cable, the present disclosure is not limited thereto. For example, the same idea may be applied even to the case in which the branch circuit 150 is a waveguide.

According to the embodiment described above, the electromagnetic wave supply mechanism (the microwave introduction device 105) is an electromagnetic wave supply mechanism for supplying an electromagnetic wave into a processing container (e.g., the processing container 101) serving as a load, and includes the first branch circuit (the branch circuit 150). The first branch circuit is provided downstream of the radio-frequency power source (the microwave outputter 130) configured to generate the electromagnetic wave and is configured as a waveguide. Further, the first branch circuit is configured to include the first waveguide 151 having the input end 154, the plurality of second waveguides 152 having the respective output ends 155, and the branch point 153 at which the first waveguide 151 is branched into the plurality of second waveguides 152 corresponding to n branches (where n is an integer equal to or greater than 2). The output ends 155 are connected to the load or input ends (the input ends 154a and 154b) of second branch circuits (the branch circuits 150a and 150b), which are branch circuits subsequent to the first branch circuit. In the first branch circuit, when the total number of the output ends 155 seen from the branch point 153 is n, the lengths of the second waveguides 152 from the branch point 153 to the n output ends 155 differ from each other by m×$\lambda/2$+($\lambda/2$)/n, respectively (where m is 0 or a positive integer). As a result, it is possible to reduce reflected power when the electromagnetic wave is branched and introduced to a plural locations.

According to the embodiment, the second and subsequent waveguides 152 among the plurality of second waveguides 152 have a bent structure in the lengths of the second waveguides 152. As a result, the arrangement positions of the output ends 155 of the second and subsequent waveguides 152 may be adjusted.

According to this embodiment, the matcher is additionally connected between the high frequency power source and the branch point 153. As a result, the reflected power may be further reduced.

According to the embodiment, the second branch circuits have the same configuration as the first branch circuit and are connected in series to the first branch circuit. As a result, the reflected power may be further reduced.

According to the embodiment, the processing container includes a plurality of processing containers. As a result, even when the electromagnetic wave is distributed to the plurality of processing containers, the reflected power may be reduced.

According to the embodiment, each of the plurality of processing containers has an identical reflection coefficient when each of the processing container serves as the load. As a result, reflected waves from the respective processing containers may be cancelled out.

According to the embodiment, the processing container includes a single processing container, and the electromagnetic wave is supplied at plural locations into the single processing container. As a result, the reflected power may be reduced when the electromagnetic wave is branched and introduced to the plural locations.

According to this embodiment, each of the plural locations of the single processing container has an identical reflection coefficient when each of the plural locations becomes the load. As a result, reflected waves from the different locations of the single processing container may be cancelled out.

According to the embodiment, the allowable error of each of the lengths of the plurality of second waveguides 152 is set based on the wavelength of the electromagnetic wave in the waveguide and the n branches of the branch point 153. As a result, the allowable error may be set in proportion to the wavelength of the electromagnetic wave.

According to the present disclosure in some embodiments, it is possible to reduce reflection power when an electromagnetic wave is branched and introduced to plural locations.

It should be noted that the embodiments disclosed herein are exemplary in all respects and are not restrictive. The above-described embodiments may be omitted, replaced or modified in various forms without departing from the scope and spirit of the appended claims.

The following configurations may be taken in the present disclosure.

(1) An electromagnetic wave supply mechanism for supplying an electromagnetic wave into a processing container serving as a load, includes a first branch circuit provided downstream of a radio-frequency power source configured to generate the electromagnetic wave, the first branch circuit being configured as a waveguide and including a first waveguide having an input end, a plurality of second waveguides having respective output ends, and a branch point at which the first waveguide is branched into the plurality of second waveguides corresponding to n branches (where n is an integer equal to or greater than 2), wherein each of the output ends is connected to the load or an input end of a second branch circuit subsequent to the first branch circuit, and in the first branch circuit, when a total number of the output ends seen from the branch point is n, lengths of the plurality of second waveguides from the branch point to the n output ends differ from each other by $m \times \lambda/2 + (\lambda/2)/n$ (where m is 0 or a positive integer).

(2) In the electromagnetic wave supply mechanism of (1) above, the plurality of second waveguides has a bent structure in which the lengths of the second and subsequent second waveguides are bent.

(3) In the electromagnetic wave supply mechanism of (1) or (2) above, a matcher is connected between the radio-frequency power source and the branch point.

(4) In the electromagnetic wave supply mechanism of any one of (1) to (3) above, the second branch circuit is identical in configuration to the first branch circuit and is connected in series to the first branch circuit.

(5) In the electromagnetic wave supply mechanism of any one of (1) to (4) above, the processing container includes a plurality of processing containers.

(6) In the electromagnetic wave supply mechanism of (5) above, when each of the plurality of processing containers serves as the load, the plurality of processing containers are identical in reflection coefficient to each other.

(7) In the electromagnetic wave supply mechanism of any one of (1) to (4) above, the processing container includes a single processing container, and the electromagnetic wave is supplied into the single processing container at plural locations of the single processing container.

(8) In the electromagnetic wave supply mechanism of (7) above, when each of the plural locations serves as the load, the plural locations are identical in reflection coefficient to each other.

(9) In the electromagnetic wave supply mechanism of any one of (1) to (8) above, an allowable error of each of the lengths of the plurality of second waveguides is set based on a wavelength of the electromagnetic wave in the waveguide and the n branches of the branch point.

(10) A plasma processing apparatus includes a processing container, an electromagnetic wave supply mechanism configured to supply an electromagnetic wave into the processing container serving as a load, and a radio-frequency power source configured to generate the electromagnetic wave. The electromagnetic wave supply mechanism includes a first branch circuit provided downstream of the radio-frequency power source and configured as a waveguide, the first branch circuit including a first waveguide having an input end, a plurality of second waveguides having respective output ends, and a branch point at which the first waveguide is branched into the plurality of second waveguides corresponding to n branches (where n is an integer equal to or greater than 2). Each of the output ends is connected to the load or an input end of a second branch circuit subsequent to the first branch circuit. In the first branch circuit, when a total number of the output ends seen from the branch point is n, lengths of the second waveguides from the branch point to the n output ends differ from each other by $m \times \lambda/2 + (\lambda/2)/n$ (where m is 0 or a positive integer).

What is claimed is:

1. An electromagnetic wave supply mechanism for supplying an electromagnetic wave into a processing container serving as a load, the electromagnetic wave supply mechanism comprising:

a first branch circuit provided downstream of a radio-frequency power source configured to generate the electromagnetic wave, the first branch circuit being configured as a waveguide and including a first waveguide having an input end, a plurality of second waveguides having respective output ends, and a branch point at which the first waveguide is branched into the plurality of second waveguides corresponding to n branches (where n is an integer equal to or greater than 2), wherein each of the output ends is connected to the load or an input end of a second branch circuit subsequent to the first branch circuit, and wherein, in the first branch circuit, when a total number of the output ends seen from the branch point is n, lengths of the plurality of second waveguides from the branch point to the n output ends differ from each other by $m \times \lambda/2 + (\lambda/2)/n$ (where m is 0 or a positive integer).

2. The electromagnetic wave supply mechanism of claim 1, wherein the plurality of second waveguides has a bent structure in which the lengths of second and subsequent second waveguides are bent.

3. The electromagnetic wave supply mechanism of claim 2, wherein a matcher is connected between the radio-frequency power source and the branch point.

4. The electromagnetic wave supply mechanism of claim 1, wherein a matcher is connected between the radio-frequency power source and the branch point.

5. The electromagnetic wave supply mechanism of claim 1, wherein the second branch circuit is identical in configuration to the first branch circuit and is connected in series to the first branch circuit.

6. The electromagnetic wave supply mechanism of claim 1, wherein the processing container includes a plurality of processing containers.

7. The electromagnetic wave supply mechanism of claim 6, wherein, when each of the plurality of processing containers serves as the load, the plurality of processing containers are identical in reflection coefficient to each other.

8. The electromagnetic wave supply mechanism of claim 1, wherein the processing container includes a single processing container, and the electromagnetic wave is supplied into the single processing container at plural locations of the single processing container.

9. The electromagnetic wave supply mechanism of claim 8, wherein, when each of the plural locations serves as the load, the plural locations are identical in reflection coefficient to each other.

10. The electromagnetic wave supply mechanism of claim 1, wherein an allowable error of each of the lengths of the plurality of second waveguides is set based on a wavelength of the electromagnetic wave in the waveguide and the n branches of the branch point.

11. A plasma processing apparatus, comprising:

a processing container;

an electromagnetic wave supply mechanism configured to supply an electromagnetic wave into the processing container serving as a load; and a radio-frequency power source configured to generate the electromagnetic wave, wherein the electromagnetic wave supply mechanism includes a first branch circuit provided downstream of the radio-frequency power source and configured as a waveguide, the first branch circuit including a first waveguide having an input end, a plurality of second waveguides having respective output ends, and a branch point at which the first waveguide is branched into the plurality of second waveguides corresponding to n branches (where n is an integer equal to or greater than 2), wherein each of the output ends is connected to the load or an input end of a second branch circuit subsequent to the first branch circuit, and wherein, in the first branch circuit, when a total number of the output ends seen from the branch point is n, lengths of the second waveguides from the branch point to the n output ends differ from each other by $m \times \lambda/2 + (\lambda/2)/n$ (where m is 0 or a positive integer).

\* \* \* \* \*